US007436384B2

(12) United States Patent
An

(10) Patent No.: US 7,436,384 B2
(45) Date of Patent: Oct. 14, 2008

(54) DATA DRIVING APPARATUS AND METHOD FOR LIQUID CRYSTAL DISPLAY

(75) Inventor: Jong Ki An, Taegu-shi (KR)

(73) Assignee: LG Display Co., Ltd., Seoul (KR)

( * ) Notice: Subject to any disclaimer, the term of this patent is extended or adjusted under 35 U.S.C. 154(b) by 384 days.

(21) Appl. No.: 10/125,454

(22) Filed: Apr. 19, 2002

(65) Prior Publication Data

US 2003/0117362 A1 Jun. 26, 2003

(30) Foreign Application Priority Data

Dec. 26, 2001 (KR) .......................... 10-2001-85336

(51) Int. Cl.
*G09G 3/36* (2006.01)
*H01L 29/04* (2006.01)
*H01L 39/10* (2006.01)
*H01L 31/00* (2006.01)

(52) U.S. Cl. ............................ 345/98; 257/57; 257/59; 257/213; 257/240; 257/241; 345/99; 345/100

(58) Field of Classification Search ........... 345/87–100; 257/57, 59, 213, 240, 241
See application file for complete search history.

(56) References Cited

U.S. PATENT DOCUMENTS

| | | | | |
|---|---|---|---|---|
| 4,597,001 | A * | 6/1986 | Bortscheller et al. | 257/57 |
| 5,170,158 | A * | 12/1992 | Shinya | 345/98 |
| 5,737,368 | A | 4/1998 | Shou et al. | |
| 6,097,362 | A | 8/2000 | Kim | |
| 6,229,512 | B1 * | 5/2001 | Shigehiro | 345/98 |
| 6,281,891 | B1 | 8/2001 | DaCosta et al. | |
| 6,333,729 | B1 * | 12/2001 | Ha | 345/98 |

FOREIGN PATENT DOCUMENTS

| | | | |
|---|---|---|---|
| CN | 1153427 | | 7/1997 |
| CN | 1291762 | A | 4/2001 |
| EP | 0729186 | A1 | 8/1996 |
| EP | 0802571 | A2 | 10/1997 |
| GB | 2154820 | A | 9/1985 |
| JP | 04-170515 | | 6/1992 |
| JP | 09-033891 | | 2/1997 |
| JP | 2000-150895 | | 5/1997 |
| JP | 11038946 | A * | 2/1999 |
| JP | 11-259036 | | 9/1999 |
| JP | 2001-221990 | | 8/2001 |

OTHER PUBLICATIONS

"Survey on the Development of the Manufacturing Process for Thin Film Transistors," Apr. 30, 1997. (Chinese document).

* cited by examiner

*Primary Examiner*—Sumati Lefkowitz
*Assistant Examiner*—Alexander S Beck
(74) *Attorney, Agent, or Firm*—Morgan, Lewis & Bockius LLP

(57) ABSTRACT

A data driving apparatus for a liquid crystal display includes a plurality of data driving integrated circuits adjacent to a liquid crystal display panel for converting input pixel data into pixel voltage signals, one or more multiplexor arrays provided adjacent to the liquid crystal display panel to make a time-division of a plurality of data lines into a plurality of regions to selectively apply the pixel voltage signals from the plurality of data driving integrated circuits to the plurality of data lines.

4 Claims, 5 Drawing Sheets

DATA DRIVING APPARATUS AND METHOD FOR LIQUID CRYSTAL DISPLAY

This application claims the benefit of Korean Patent Application No. P2001-85336 filed in Korea on Dec. 26, 2001, which is hereby incorporated by reference.

BACKGROUND OF THE INVENTION

1. Field of the Invention

The present invention relates to a liquid crystal display, and more particularly, to a data driving apparatus and method for a liquid crystal display wherein data lines can be driven on a time division basis to reduce the number of data driver integrated circuits.

2. Discussion of the Related Art

In general, a liquid crystal display (LCD) controls a light transmittance of a liquid crystal by using an applied electric field in order to display an image (picture). The LCD includes a liquid crystal display panel-having liquid crystal cells arranged in a matrix type, and a driving circuit for driving the liquid crystal display panel. The liquid crystal display panel includes gate lines and data lines arranged to cross each other, and each liquid crystal cell is positioned where the gate lines cross the data lines. The liquid crystal display panel is provided with a pixel electrode and a common electrode for applying an electric field to each of the liquid crystal cells. Each pixel electrode is connected to a corresponding one of the data lines via source and drain electrodes of a thin film transistor, which functions as a switching device. The gate electrode of the thin film transistor is connected to a corresponding one of the gate lines, thereby allowing a pixel voltage signal to be applied to the pixel electrodes for each corresponding data line.

The driving circuit includes a gate driver for driving the gate lines, a data driver for driving the data lines, and a common voltage generator for driving the common electrode. The gate driver sequentially applies a scanning signal to each of the gate lines in order to sequentially drive the liquid crystal cells on the liquid crystal display panel one gate line at a time. The data driver applies a data voltage signal to each of the data lines whenever the gate signal is applied to any one of the gate lines. The common voltage generator applies a common voltage signal to the common electrode. Accordingly, the LCD controls a light transmittance by application of an electric field between the pixel electrode and the common electrode in accordance with the data voltage signal for each liquid crystal cell, thereby displaying an image. The data driver and the gate driver are incorporated into a plurality of integrated circuits (IC's). The integrated data driver IC and gate driver IC are mounted in a tape carrier package (TCP) to be connected to the liquid crystal display panel by a tape automated bonding (TAB) system, or mounted in the liquid crystal display panel by a chip on glass (COG) system.

FIG. 1 schematically shows a data driving block of an LCD according to the conventional art. In FIG. 1, a data driving block includes data driving IC's 6 connected to a liquid crystal display panel 2 via data TCP's 4, and gate driving IC's 9 connected to gate lines of the liquid crystal display panel 2 via gate TCP's 8. The gate TCP's 8 mounted with the gate driving IC's 9 are electrically connected to gate pads provided at one side of the liquid crystal display panel 2. The gate driving IC's 9 apply a gate signal (scanning signal) to the gate lines of the liquid crystal display panel 2. The data TCP's 4 mounted with the data driving IC's 6 are electrically connected to data pads provided at an upper portion of the liquid crystal display panel 2. The data driving IC's 6 convert digital pixel data signals into analog pixel voltage signals and apply the analog pixel voltage signals to the data lines of the liquid crystal display panel 2.

FIG. 2 is a detailed block diagram showing a configuration of the data driving integrated circuit in FIG. 1. In FIG. 2, each of the data driving IC's 6 includes a shift register part 14 for applying a sequential sampling signal, a latch part 16 for sequentially latching and outputting a pixel data VD in response to the sampling signal, a digital-to-analog converter (DAC) 18 for converting the pixel data VD from the latch part 16 into a pixel signal, and an output buffer part 26 for buffering and outputting the pixel signal from the DAC 18. Furthermore, each of the data driving IC's 6 includes a signal controller 10 for interfacing various control signals from a timing controller (not shown) and the pixel data VD, and a gamma voltage part 12 for supplying positive and negative gamma voltages required in the DAC 18. Each of the data driving IC's 6 drives an n-number of data lines D1 to Dn.

The signal controller 10 controls various control signals (SSP, SSC, SOE, REV and POL) and the pixel data VD to output the control signals and pixel data VD to various corresponding elements. The gamma voltage generator part 12 sub-divides several gamma reference voltages generated from a gamma reference voltage generator (not shown) for each gray level, and outputs signals to the DAC 18.

The shift register part 14 includes a plurality of shift registers that sequentially shift a source start pulse SSP that is received from the signal controller 10 in response to a source sampling clock signal SSC, and output the source start pulse SSP as a sampling signal.

The latch part 16 sequentially samples the pixel data VD received from the signal controller 10 in response to the sampling signal received from the shift register part 14 to latch the pixel data VD. Accordingly, the latch part 16 comprises an n-number of latches for latching an n-number of the pixel data VD, wherein each of the n-number of latches has a size corresponding to a bit number (i.e., 3 bits or 6 bits) of the pixel data VD. Subsequently, the latch part 16 simultaneously outputs an n-number of pixel data VD in response to a source output enable signal SOE received from the signal controller 10.

The DAC 18 simultaneously converts and outputs the pixel data VD received from the latch part 16 into positive and negative pixel signals. Accordingly, the DAC 18 includes a positive (P) decoding part 20 and a negative (N) decoding part 22 that are both commonly connected to the latch part 16, and a multiplexor (MUX) 24 for selecting output signals of the P decoding part 20 and the N decoding part 22. The P decoding part 20 includes P decoders that convert the n-number of pixel data simultaneously input from the latch part 16 into positive pixel signals in combination with the positive gamma voltages output from the gamma voltage part 12. The N decoding part 22 includes N decoders that convert the n-number of pixel data simultaneously input from the latch part 16 into negative pixel signals in combination with the gamma voltages output from the gamma voltage part 12. The multiplexor 24 responds to a polarity control signal POL received from the signal controller 10 to selectively output either one of the positive pixel signals received from the P decoding part 20 or the negative pixel signals received from the N decoding part 22.

The output buffer part 26 includes an n-number of output buffers that comprise voltage followers connected in series to the n-number of data lines D1 to Dn. The n-number of output buffers buffer the pixel voltage signals received from the DAC 18, and applies the buffered pixel voltage signals to the n-number of data lines D1 to Dn.

Accordingly, each of the data driving IC's 6 according to the conventional art require a 2n-number of decoders in addition to an n-number of latches, multiplexors and output buffers in order to drive the n-number of data lines D1 to Dn. As a result, the data driving IC's 6 according to the conventional art have a complex configuration, and hence a manufacturing cost that is 20% to 30% of the total manufacturing cost of a liquid crystal display module.

SUMMARY OF THE INVENTION

Accordingly, the present invention is directed to a data driving apparatus and method for a liquid crystal display that substantially obviates one or more of problems due to limitations and disadvantages of the related art.

Another object of the present invention is to provide a data driving apparatus and method for driving a liquid crystal display wherein data lines can be driven on a time division basis to reduce the number of data driving IC's.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a data driving apparatus for a liquid crystal display includes a plurality of data driving integrated circuits adjacent to a liquid crystal display panel for converting input pixel data into pixel voltage signals, and one or more multiplexor arrays provided adjacent to the liquid crystal display panel to make a time-division of a plurality of data lines into a plurality of regions to selectively apply the pixel voltage signals from the plurality of data driving integrated circuits to the plurality of data lines.

In another aspect of the present invention, a data driving method for a liquid crystal display includes converting input pixel data into pixel voltage signals, performing a time-division of a plurality of data lines into a plurality of regions by a multiplexor array to selectively apply the pixel voltage signals from a plurality of data driving integrated circuits to the plurality of data lines, and controlling the data driving integrated circuits and the multiplexor array for re-arranging the pixel data to be supplied to each of the data driving integrated circuits to make the time-division of the pixel data into the plurality of regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 3:
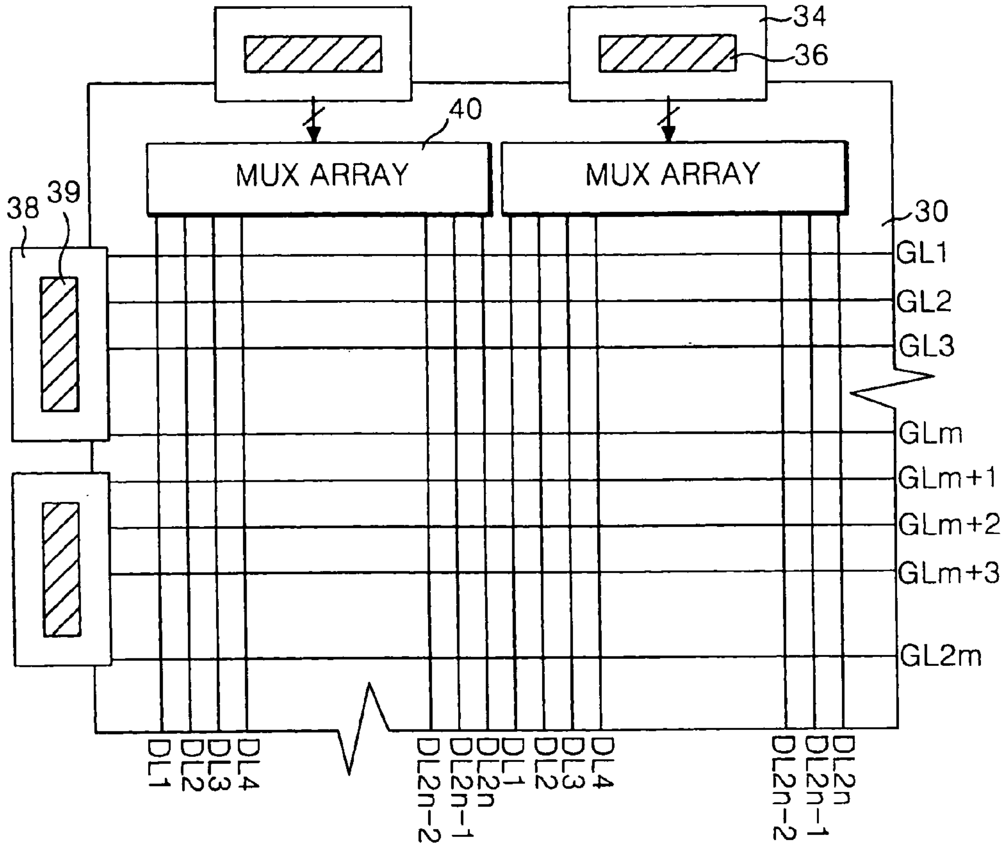
FIG. 3 is a plane view of a exemplary liquid crystal display including a data driving apparatus according to the present invention.

FIG. 3 is a plane view of a exemplary liquid crystal display including a data driving apparatus according to the present invention. In FIG. 3, a liquid crystal display may include a plurality of data driving IC's 36 connected to an n-number of data lines DL1 to DL2n of a liquid crystal display panel 30 via a plurality of TCP's 34, a plurality of gate driving IC's 39 connected to an m-number of gate lines GL1 to GL2m of the liquid crystal display panel 30 via a plurality of gate TCP's 38, a plurality of multiplexor arrays 40 provided within the liquid crystal display panel 30 to apply pixel voltage signals received from the plurality of data driving IC's 36 to the n-number of data lines DL1 to DL2n on a time-division basis, and a timing controller (not shown) for controlling a driving of the plurality of data driving IC's 36 and the plurality of gate driving IC's 39. Each of the plurality of multiplexor arrays 40 may make an N frequency division (wherein N=2, 3, . . . ) of the n-number of data lines DL1 to DL2n driven with a signal received of a corresponding data driving IC 36, thereby reducing a total number of the plurality of data driving IC's 36 to 1/N.

A case where the n-number of data lines DL1 to DL2n are subject to a two frequency division (N=2) by the plurality of multiplexor arrays 40 will now be described. The timing controller (not shown) applies pixel data signals to the data driving IC's 36, and controls the driving of the gate driving IC's 39 and the data driving IC's 36. In particular, the timing controller re-arranges an arrangement sequence of a 2n-number of pixel data that is to be supplied to a 2n-number of data lines DL1 to DL2n in conformity to a driving sequence of the 2n-number of data lines DL1 to DL2n. The timing controller re-arranges the sequence by the signal of the data driving IC 36, and then makes an n-time division of the re-arranged pixel data. For example, first the timing controller re-arranges the 2n-number of pixel data that is to be supplied to the signal of the data driving IC 36 by separating the rearranged 2n-number of pixel data into odd-numbered data and even-numbered data, then the timing controller applies an n-numbered odd pixel data to the data driving IC 36 and an n-numbered even pixel data to the data driving IC 36.

Figure 1:
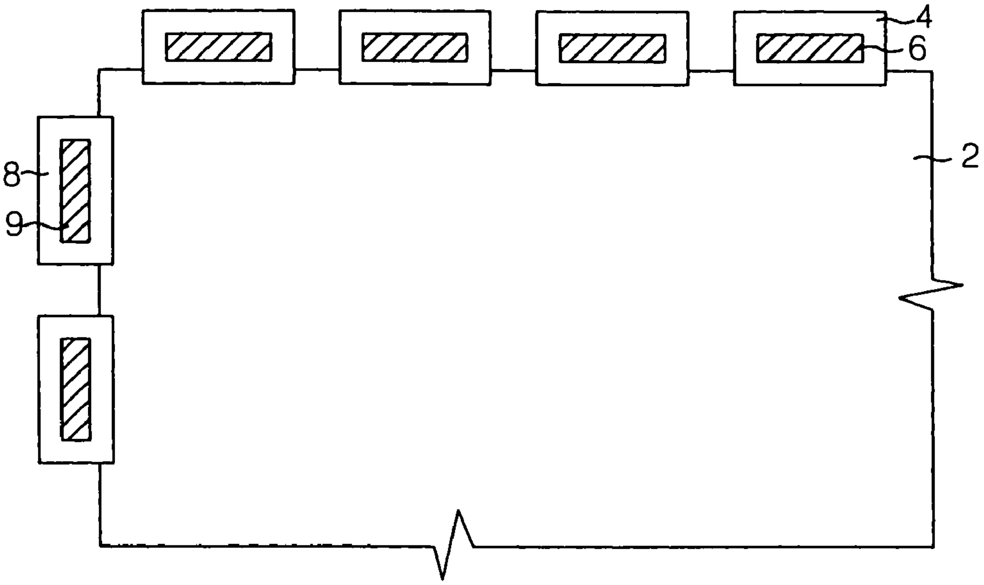
FIG. 1 CONVENTIONAL ART
FIG. 1 is a schematic view showing a data driving apparatus of a liquid crystal display according to the conventional art.
Figure 2:
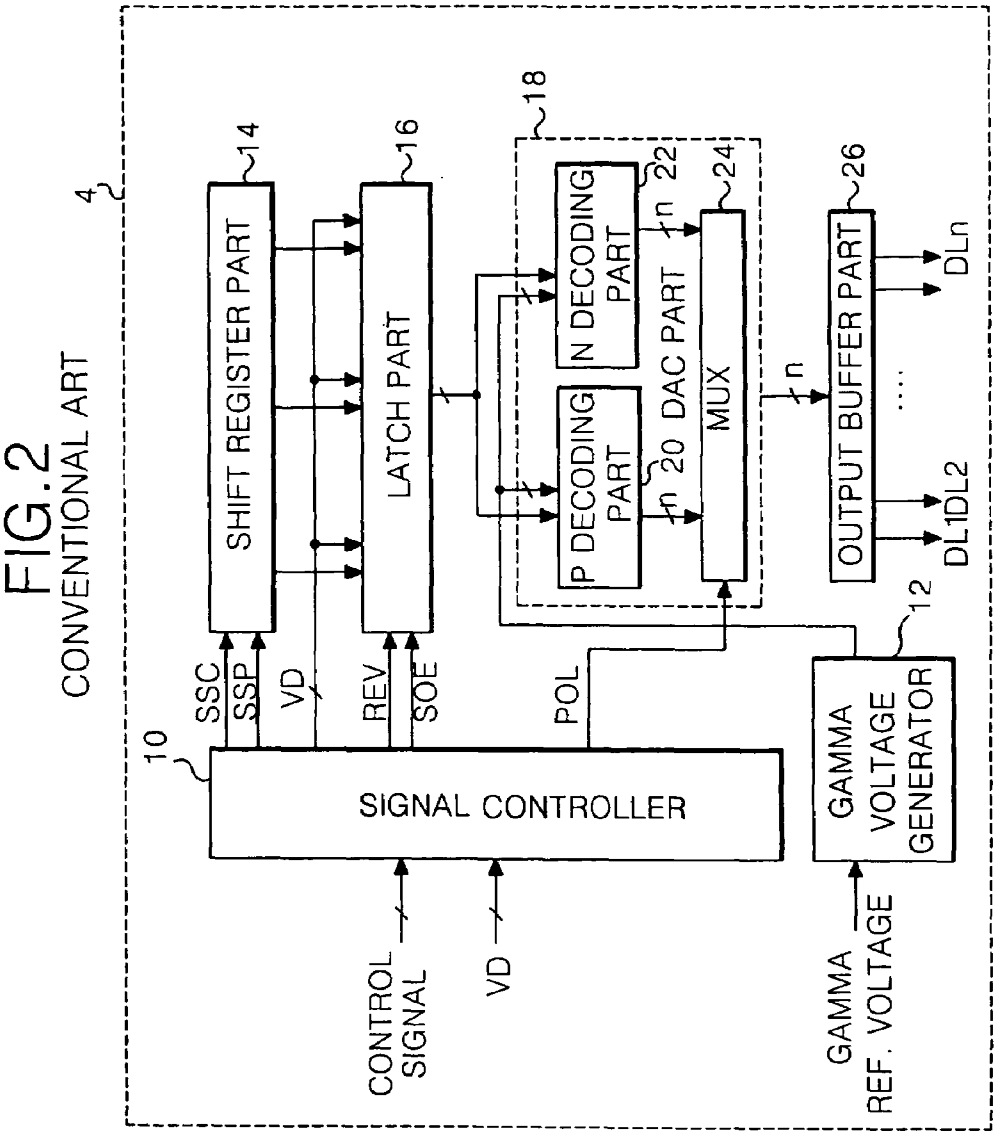
FIG. 2 CONVENTIONAL ART
FIG. 2 is a detailed block diagram showing a configuration of the data driving integrated circuit in FIG. 1.

The gate TCP's 38 that are mounted with the gate driving IC's 39 may be electrically connected to gate pads that extend from an m-number of gate lines GL1 to GL2m of the liquid crystal display panel 30. The gate driving IC's 39 may apply a gate signal (scanning signal) to the m-number of gate lines GL1 to GL2m of the liquid crystal display panel 30. Each of the plurality of data TCP's 34 mounted with the plurality of data driving IC's 36 may be electrically connected to input terminal pads of the multiplexor array 40 that may be provided at an upper portion of the liquid crystal display panel 30. The plurality of data driving IC's 36 may convert and apply digital pixel data signals into analog pixel voltage signals to the plurality of multiplexor arrays 40 of the liquid crystal display panel 30. In particular, each data driving IC 36 may apply a 2n-number of pixel voltage signals to be supplied to the 2n-number of data lines DL1 to DL2n to the multiplexor array 40 in an "n-by-n" order. Accordingly, each of the plurality of data driving IC's 36 may include similar elements as the data driving IC 6 shown in FIG. 2, whereby each data driving IC 36 outputs pixel voltage signals twice in the "n-by-n" order during every frame.

Figure 4:
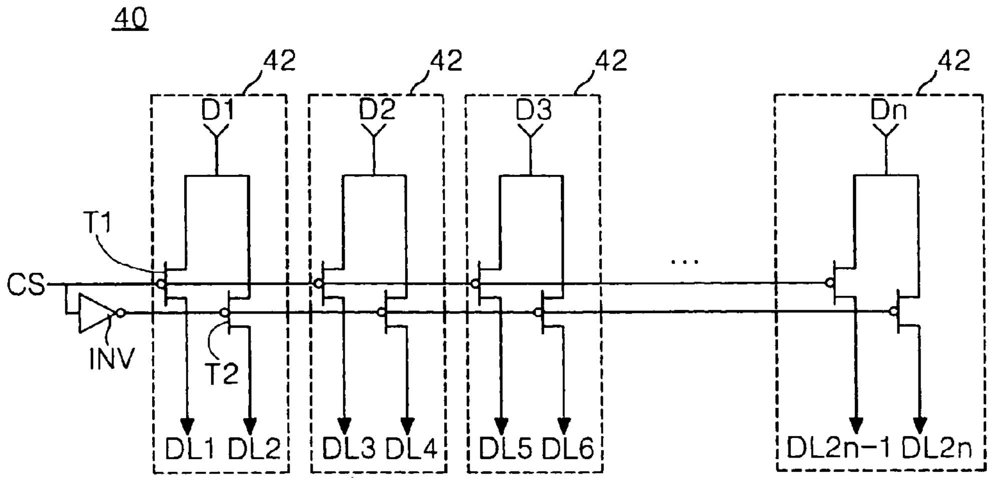
FIG. 4 is a detailed circuit diagram of the exemplary multiplexor array shown in FIG. 3 according to the present invention.

FIG. 4 is a detailed circuit diagram of the exemplary multiplexor array shown in FIG. 3 according to the present invention. In FIG. 4, each multiplexor array 40 may make a two frequency division of the 2n-number of data lines DL1 to DL2n to selectively apply the pixel voltage signals inputted from each data driving IC 36 in the "n-by-n" order to the 2n-number of data lines DL1 to DL2n. More specifically, each multiplexor array 40 includes an n-number of multiplexors 42 for selectively connecting an n-number of output terminals D1 to Dn of the data driving IC's 36 to any two of the data lines DL1 to DL2n.

Each of the multiplexors 42 may include a first transistor T1 for providing a switching operation in response to a control signal CS received from the timing controller, and a second transistor T2 for providing a switching operation in response to an phase-inverted control signal/CS received from an inverter INV. The first and second transistors T1 and T2 selectively output one pixel voltage signal to the odd data lines or the even data lines by an opposite switching operation. Accordingly, the multiplexor array 40 makes a two frequency division of the 2n-number of data lines DL1 to Dl2n into an n-number of odd data lines DL1, DL3, . . . , DL2n−1 and an n-number of even data lines DL2, DL4, . . . , DL2n to drive the data lines.

The multiplexor array 40 is provided on the liquid crystal display panel 30, and may be formed simultaneously with formation of a thin film transistor (TFT) array of the liquid crystal display panel 30. The TFT may be used as a switching device for each liquid crystal cell in the liquid crystal display panel 30, and may have an active layer formed from amorphous silicon, for example. Thus, the TFT may have a relatively low conductivity. Accordingly, a typical channel size (i.e., W/L=30/6) of the TFT may result in a relatively large turn-on resistance on the order of several MΩ, thereby permitting a current flow of only a few μA. However, the transistors T1 and T2 included in the multiplexor array 40 should maintain a turn-on resistance of about several kΩ in order to provide time-divisional driving of the data lines DL1 to DL2n. Accordingly, in order to reduce turn-on resistances of the amorphous silicon type transistors T1 and T2 included in the multiplexor array 40 to several kΩ, it may be necessary to provide a channel width ratio W/L as large as possible.

Figure 5:
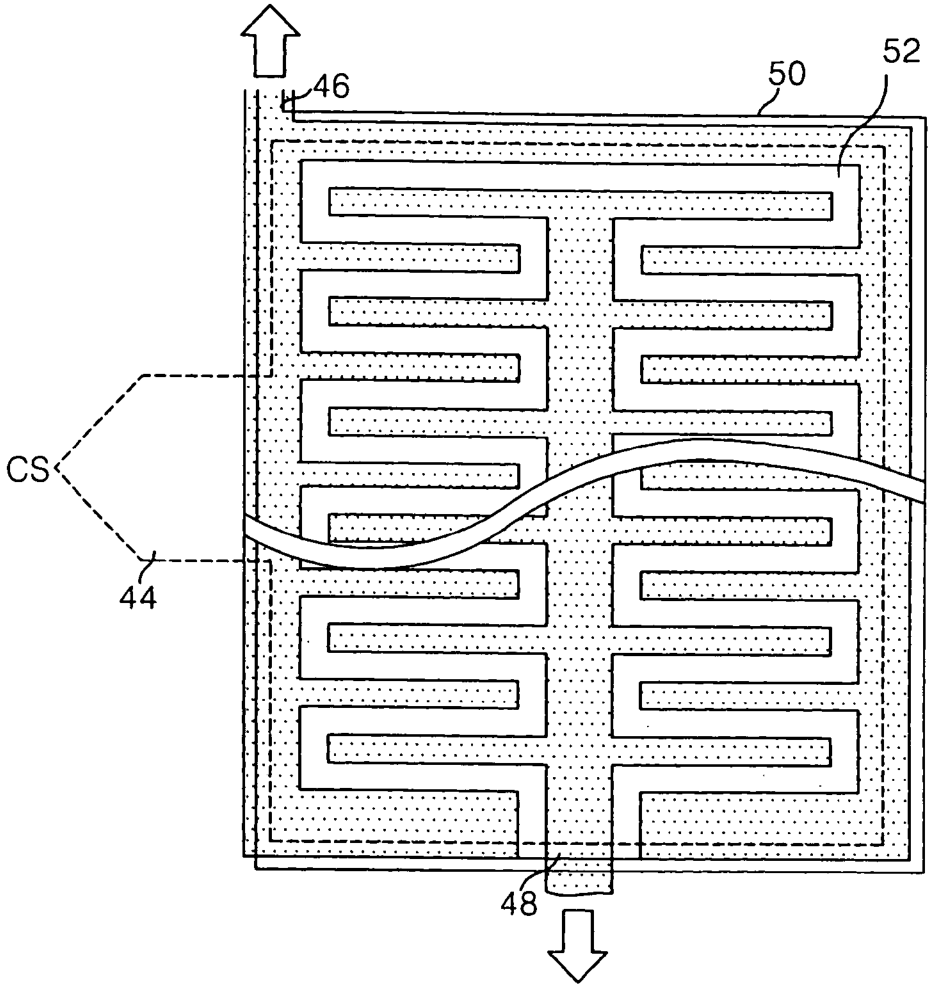
FIG. 5 is a plane view showing an exemplary configuration of the thin film transistor shown in FIG. 4 according to the present invention.

FIG. 5 is a plane view showing an exemplary configuration of the thin film transistor shown in FIG. 4 according to the present invention. In FIG. 5, each of the transistors T1 and T2 may include a gate electrode 44, an active layer 50 interposed between the gate electrode 44 and a gate insulating film, and source and drain electrodes 46 and 48 provided on the active layer 50, thereby forming a finger-shaped channel 52. The source electrode 46 may include a square band for enclosing an outside portion of the active layer 50, and a plurality of portion symmetrically extended inwardly from two opposite sides of the square band. The drain electrode 48 may be formed to have a spacing from the square band and the extending portions of the source electrode 46 at an area defined at an inner side of the source electrode 46. Thus, the semiconductor layer 50 located between the source electrode 46 and the drain electrode 48 is provided with the finger-shaped channel 52.

The transistors T1 and T2 may have an enlarged channel size due to the finger-shaped channel 52, thereby reducing their turn-on resistance to about several kΩ. Furthermore, the transistors T1 and T2 of the multiplexor array 40 may be configured by parallel connection of a plurality of transistors each having a finger-shaped channel 52, thereby reducing a turn-on resistance of the entire channel 52. As a result, the multiplexor array 40 may be provided at a sealed area between an area attached with the data TCP and a picture display area of the liquid crystal display panel 30 without any increase of the panel dimension. Furthermore, the multiplexor array 40 may be used without any modification or additional processing steps of the TFT array process. Alternatively, a polycrystalline silicon active layer may be formed by annealing only a multiplexor array portion by means of a laser in order to reduce turn-on resistances of the transistors T1 and T2 included in the multiplexor array 40.

It will be apparent to those skilled in the art that various modifications and variations can be made in the data driving apparatus and method for a liquid crystal display of the present invention without departing from the spirit or scope of the inventions. Thus, it is intended that the present invention covers the modifications and variations of this invention provided they come within the scope of the appended claims and their equivalents.

What is claimed is:

1. A data driving apparatus for a liquid crystal display, comprising:

a plurality of data driving integrated circuits adjacent to a liquid crystal display panel to convert input pixel data into pixel voltage signals;

one or more multiplexor arrays provided adjacent to the liquid crystal display panel to make a time-division of a plurality of data lines into a plurality of regions to selectively apply the pixel voltage signals received from the plurality of data driving integrated circuits to the plurality of data lines; and a timing controller for controlling the data driving integrated circuits and the multiplexor array and for rearranging the pixel data to be supplied to each of the data driving integrated circuits to make the time-division of the pixel data into the plurality of regions, the multiplexor array including:

a plurality of switching devices to selectively drive the plurality of data lines connected thereto, and a control line electrically connected to a pair of the switching devices to apply a control signal to one switching device of the pair and an inverted control signal to the other switching device of the pair simultaneously to selectively apply the pixel voltage signals between a pair of the data lines, wherein each of the plurality of switching devices is an individual transistor including a gate electrode, a gate insulating film on the gate electrode, an active layer on the gate insulating film overlapping with the gate electrode, the active layer being formed of an amorphous silicon layer, a source electrode on the active layer having a portion overlapping with the gate electrode and the active layer, wherein the overlapping portion has a square band encompassing an outside perimeter of the gate electrode, a plurality of first portions extending inwardly from one side of the square band, and a plurality of second portions extending inwardly from an opposite side of the square band, and a drain electrode on the active layer having a portion overlapping with the gate electrode and the active layer and having a constant distance from the source electrode, wherein the overlapping portion of the drain electrode has a central portion between the first portions and the second portions, a plurality of third portions extending from one side of the central portion so as to form a first channel portion with the plurality of first portions and the first side of the source electrode, and a plurality of fourth portions extending from an opposite side of the central portion so as to form a second channel portion with the plurality of second portions and the opposite side of the source electrode, wherein the second channel portion is continuous with the first channel portion, wherein the multiplexor array is formed simultaneously with an amorphous silicon thin film transistor array for pixels of the liquid crystal display.

2. The apparatus according to claim 1, wherein each of the data driving integrated circuits includes:

shift register means for sequentially generating a sampling signal;

latch means for sequentially latching and outputting the pixel data by a certain unit in response to the sampling signal;

a digital-to-analog converter for converting the pixel data into the pixel voltage signals; and output buffer means for buffering and outputting the pixel voltage signals from the digital-to-analog converter.

3. The apparatus according to claim 1, wherein the plurality of switching devices is a parallel connection of a plurality of the individual transistors.

4. The apparatus according to claim 1, wherein the multiplexor array is positioned at a region between an attached area of a tape carrier package mounted with the plurality of data driving integrated circuits and an image display area of the liquid crystal display panel.

* * * * *